United States Patent [19]

Claes

[11] Patent Number: 4,499,439
[45] Date of Patent: Feb. 12, 1985

[54] BIFURCATED ELECTROACOUSTIC DELAY LINES

[75] Inventor: Roger G. Claes, St. Trond, Belgium

[73] Assignee: GTE Products Corporation, Stamford, Conn.

[21] Appl. No.: 487,649

[22] Filed: Apr. 22, 1983

[51] Int. Cl.³ .................. H03H 9/13; H03H 9/36; H03H 9/66
[52] U.S. Cl. .................. 333/142; 333/143; 333/149
[58] Field of Search ............. 333/141–145, 333/147, 149, 186–189

[56] References Cited

U.S. PATENT DOCUMENTS 2,781,494  2/1957  Geoghegan ............. 333/142
3,025,479  3/1962  Wolfskill ............... 333/142

Primary Examiner—Marvin L. Nussbaum
Attorney, Agent, or Firm—John A. Odozynski

[57] ABSTRACT

A bifurcated electroacoustic delay line exhibits at least a pair of substantially identical branches, each assuming a generally pentagonal profile. Each branch is configured to provide (2n+3) reflections of a desired wave at five reflective facets. The reflective pattern so defined tends to maximize the surface area available for the deposition of absorbent material so as to thereby and otherwise minimize spurious transmissions.

The branches are physically joined along at least one side and include transducers for the conversion of electrical energy to acoustical energy. An inductance connected between two such transducers couples energy from one branch to the other.

22 Claims, 11 Drawing Figures

BIFURCATED ELECTROACOUSTIC DELAY LINES

TECHNICAL FIELD

This invention relates to electroacoustic delay lines and more particularly, to a delay line characterized by a bifurcated transmission medium, comprising at least two branches exhibiting substantially identical profiles, the branches being physically joined along respective common sides, said sides remote with respect to other sides which are adapted for the attachment of transducers.

BACKGROUND OF THE INVENTION

Electroacoustic delay lines, especially those operating at ultrasonic frequencies, have found widespread use in various types of electronic equipment; exemplary equipment include radar, computers, color televison receivers and video recorders. A primary function of the delay line is the storage, or delayed transmission, of either analog or digital information for time durations in the microsecond to millisecond range.

Delay lines fabricated from solid transmission media, such as quartz, have assumed a wide variety of shapes and sizes, perhaps the simplest being a substantially straight rod provided with a piezoelectric transducer at each end. The transducers serve to convert electrical signals to ultrasonic waves at the input and ultrasonic waves to electrical signals at the output. See FIG. 1.

Because the time delay from input to output depends, of course, on the effective distance the ultrasonic wave is required to travel, the physical size of the delay line tends to be proportionate to the time delay required. A delay line such as is shown in FIG. 1 would require a rod approaching an impracticable length in order to effect relatively long delays, as are often required. Be aware that typical transmission media require roughly a 2.5 mm effective signal path in order to provide a one microsecond delay. This drawback has impelled the development of delay line configurations more sophisticated than that of the simple rod shown in FIG. 1.

One approach to a reduction in delay line size is characterized by a transmission medium shaped as a regular or an irregular polygon. In such a configuration the signal path is "folded" through the use of multiple reflections at the facets of the polygon. U.S. Pat. Nos. 2,672,590, entitled "Delay Line", and 2,839,731, entitled "Multifacet Ultrasonic Delay Line", both by McSkimer et al., exemplify these delay line configurations.

Even longer delays may be effectuated by "double-deck" delay lines such as shown in FIGS. 2A and 2B. The double-deck delay lines in fact comprise two substantially identical delay lines 21 and 22 in which the ultrasonic wave is coupled from one to the other through the operation of a V-shaped coupling wedge 23.

In the polygonally-configured delay lines alluded to above, the number of wave reflections and, consequently, the total delay provided, are limited by the following factors:

(1) As the number of polygonal facets is increased, the tolerance to which the transmission medium is to be ground becomes more stringent in order to circumvent the cumulative effect of deviations from the nominal angles of incidence and reflections at each of the facets.

(2) As the number of reflection is increased, the supression of "spurious" signals becomes more problematic. The spurious signals may be assumed to be at least four-fold in origin:
  (i) Signals caused by impedance mismatch at the input or output transducer and which result in reflections at those transducers. These signals will be present at the output at integer multiples of the desired delay time.
  (ii) Signals caused by insufficient directivity of the transducer. To wit: signals that travel paths other than the desired signal path and therefore appear at the output displaced by random time intervals from the desired signal.
  (iii) Signals derived from reflections of the desired signal at irregularities such as cracks and surface roughness in the solid medium.
  (iv) Signals directly coupled from the input to output transducer.

(3) Reduction in the physical size of the transducer is attended by a reduction of the size of the transducers, and a commensurate degradation in the transducer directivity. Degraded transducer directivity contributes to the occurrence of spurious signals alluded to above.

(4) As the number of reflections is increased, the cumulative scattering of the desired signal because of surface roughness or other irregularities at each reflection is increased.

(5) As the number of reflections is increased, the total volume of the transmission medium devoted to the desired signal path is increased. In a typical solid transmission delay line unused portions of the medium (that is, those portions not required for the propogation of the desired signal) are coated with a damping material in order to suppress spurious signals. Because the area allowed to be coated is diminished, the absorbent effect on spurious signals is likewise diminished.

For example, FIG. 3 depicts a delay line as it might be used in a color television receiver in order to insert a 63.943±0.005 microsecond delay. (This delay, equal to approximately the horizontal line period, is often required as a part of video enhancement techniques such as comb filtering.) The delay line in FIG. 3 is characterized by a total of eight reflections occurring at four facets. The blackened areas on the surface of the delay line represent areas available for the deposition of a damping material. In a specific embodiment, each of these areas might be approximately 2 millimeters square.

By way of comparison, FIG. 4 depicts a delay line of equivalent duration but characterized by twelve reflections occurring at the four facets. Each of the blackened areas is approximately 0.6 millimeter square, respresenting a surface area less than one-tenth that of the areas in FIG. 3. Significantly, the spurious response level of the unit in FIG. 3 was measured at −40 db with respect to the desired signal while the corresponding measurement performed on the unit of FIG. 4 resulted in a figure of −25 db.

Accordingly this invention is directed to a delay line that achieves the desired delay duration in a physically small device through the incorporation of a low number of reflections. The transmission medium should exhibit the desired suppression of unwanted reflections. Furthermore, it is desired that a device with the above attributes be susceptible of large volume, economical production.

DISCLOSURE OF THE INVENTION

The above and other objects, advantages and capabilities are acheived in one aspect of the invention by a bifurcated electroacoustic delay line that includes at least two branches assuming substantially identical profiles. In a specific embodiment, the profiles are pentagonal and are characterized by a first side, by second and third sides extending substantially perpendicular from the first side in a substantially parallel relationship with each other, by a fourth side extending from the second side so as to form a first obtuse angle, and by a fifth side extending from the third side so as to form a second obtuse angle substantially equivalent to the first. The fourth and fifth sides intersect along a line at which they form a third obtuse angle. The two branches are physically joined along their respective fourth and fifth sides to form an area of bifurcation.

The delay line also includes a set of transducers, an input transducer and an output transducer associated with each of the branches. The transducers are arranged so that the input transducer of the first branch is positioned laterally adjacent the output transducer of the second branch and the output transducer of the first branch is positioned laterally adjacent the input transducer of the second branch. The output transducer of the first branch is electrically coupled by a passive reactive element to the input transducer of the second branch.

The electroacoustic delay line as disclosed herein permits the effectuation of specific time delay by virtue of a delay line tending to minimal size. Because the profiles of the branches are identical, the delay line is easily fabricated through the use of a sawblade configured so as to bifurcate the transmission medium as it slices individual units from a blank.

DESCRIPTION OF A PREFERRED EMBODIMENT

For a better understanding of the subject invention, together with the objects, advantages and capabilities thereof, reference is made to the following disclosure and appended claims in junction with the above description of some of the aspects of the invention.

Figure 1:
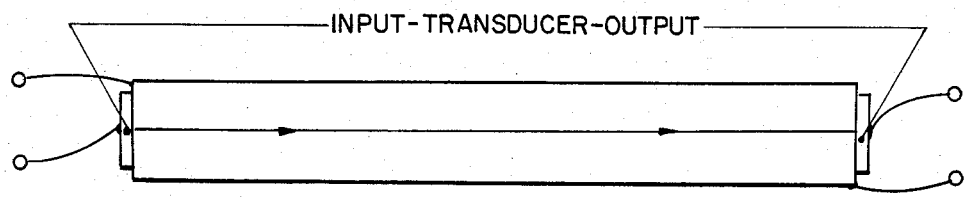
FIG. 1 depicts a relatively straight-forward implementation of an electroacoustical delay line.
Figure 2A:
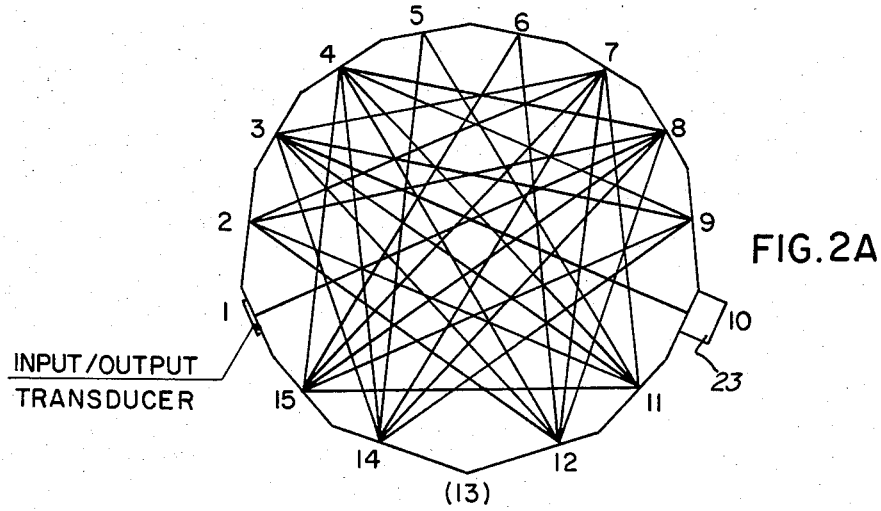
FIGS. 2A and 2B depict a "double-deck" delay line providing longer delays at a reduced delay line size.
Figure 2B:
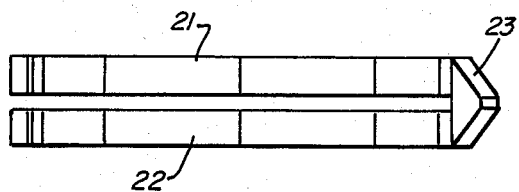
Figure 3:
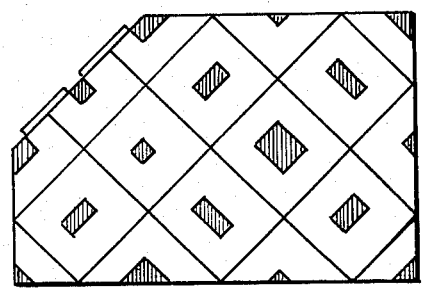
FIG. 3 depicts a delay line used in color television receivers and illustrates areas on the surface of the delay line available for deposition of absorbent material.
Figure 4:
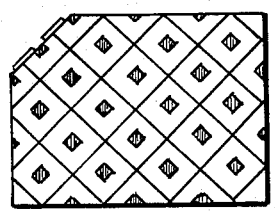
FIG. 4 depicts a delay line similar to that of FIG. 3 except providing an increased number of reflections at the sides of a delay line of comparable surface area.
Figure 5A:
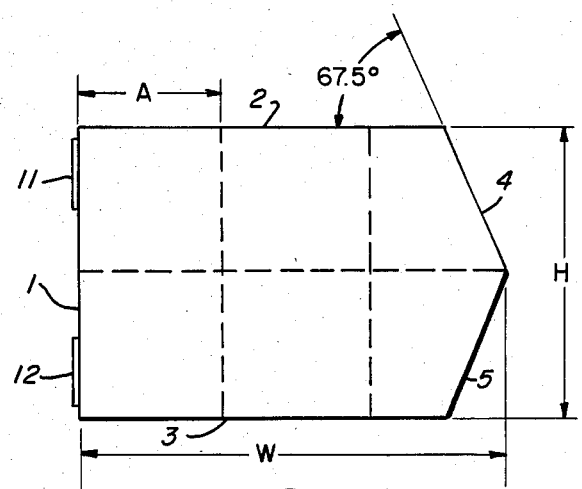
FIGS. 5A, 5B and 5C depict a delay line exhibiting a substantially pentagonal profile in accordance with the subject invention.

Referring now to FIG. 5A, the subject delay line is characterized by a first side 1 upon which are bonded transducers 11 and 12. Extending perpendicularly to side 1 and parallel to each other are sides 2 and 3. The parallel extending sides are characterized by substantially equal lengths. Sides 2 and 3 terminate at sides 4 and 5 to form an angle of approximately 135 degrees at the point of their intersection.

Figure 5B:
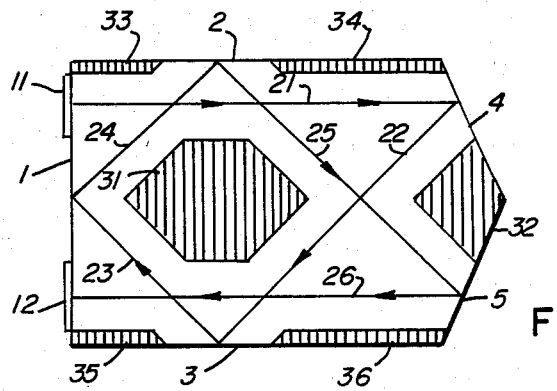

Referring now to FIG. 5B, it can be seen that an electrical signal applied to input transducer 11, subsequent its conversion to an ultrasonic acoustic wave by that transducer, propogates along a path, indicated by the broken line, that includes five reflections occurring respectively in order at sides 4, 3, 1, 2 and 5. The wave terminates at output transducer 12 where it is re-converted from acoustical to electrical energy. The total length of the path traveled by the desired acoustic wave can be shown to be, in units of "A" (see FIG. 5A),: respectively, side 4 forming an obtuse angle of approximately 112.5 degrees with side 2, side 5 forming a substantially equivalent angle with side 3. Sides 4 and 5 form an angle of approximately 135 degrees at the point of their intersection.

Figure 5C:
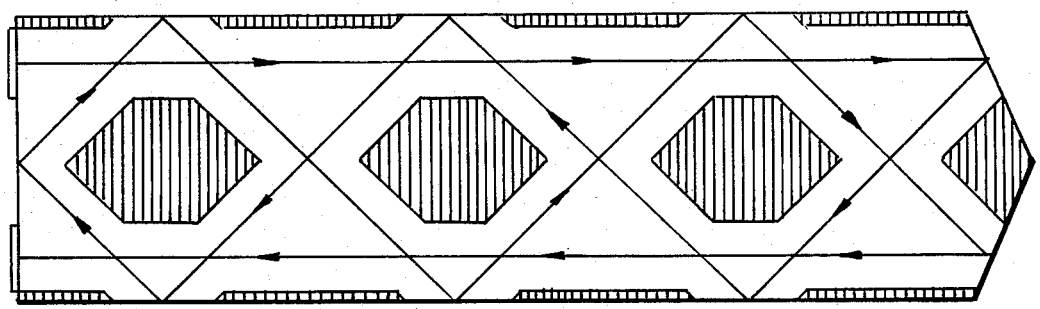

$L = \frac{2}{3}(3K-7)(1+\sqrt{2})$ and that the width, W, and height, H, of the transducer, also shown in FIG. 5A, are given by the relationships:

$W = \frac{2}{3}(3K - 15 + 2\sqrt{2})$ and $H = 2$, where K is the number of reflections. Five reflections are shown in the embodiment of FIG. 5. K can be generalized to take on values to $2n+3$, where $n = 1, 2, 3$, etc.

As can be seen from FIGS. 5A and 5B, the path traveled by the acoustic signal can be broken down into segments 21, 22, 23, 24, 25 and 26. Segment 21 defining the portion between the input transducer 11 and the first reflection, segment 22 between the first and second reflections, segment 23 between the second and third reflections, segment 24 between the third and fourth reflections, segment 25 between the fourth and fifth reflections, and segment 26 between the fifth reflection and the output transducer.

A salient advantage of the configuration defined above is that it provides large areas of the transmission medium unoccupied by the desired signal. These areas 31, 32, 33, 34, 35 and 36 in FIG. 5B are available for efficient screening of the delay line surface with absorbing material as alluded to above. As can be seen in FIG. 5B, these areas are circumscribed by the various path segments and the sides bounding the transmission medium. In particular, area 31 is bounded by segments 21, 25, 22, 26, 23 and 24; area 32 is bounded by segments 22 and 25 and by sides 4 and 5; area 33 is bounded by segments 21 and 24 and by sides 1 and 2; area 34 is bounded by segments 21 and 25 and by sides 2 and 4; area 35 is bounded by segments 26 and 23 and by sides 1 and 3; area 36 is bounded by segments 26 and 22 and by sides 5 and 3. In addition, since only a small part of sides 2 and 3 are occupied by the reflecting ultrasonic wave, the remaining area can be used for clamping the slab in a housing without deleterious effects on the performance of the delay line.

Figure 6:
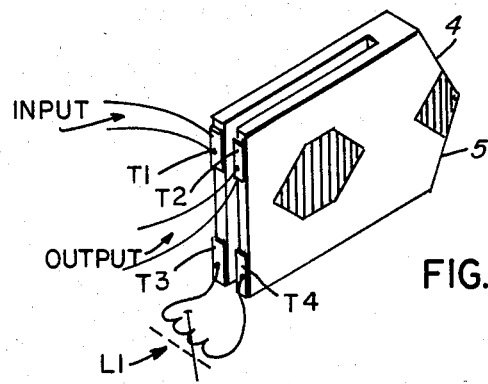
FIG. 6 depicts a bifurcated delay line having two branches of transmission medium joined along sides remote from the transducers.
Figure 7A:
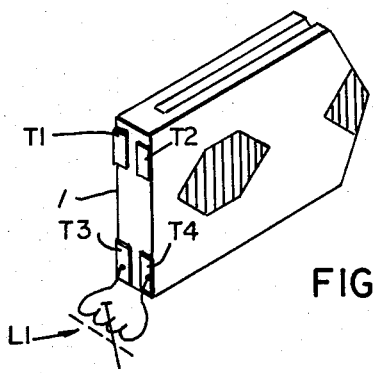
FIG. 7A depicts a bifurcated delay line having two branches of the transmission medium joined at a side immediate the transducers.
Figure 7B:
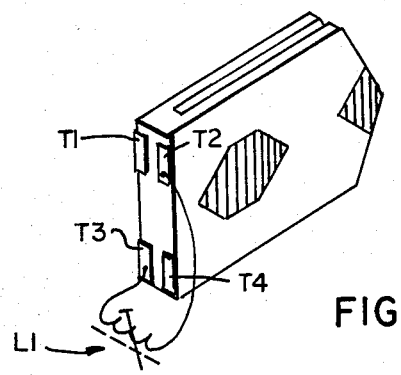
FIG. 7B depicts a bifurcated delay line with diagonal coupling between the two branches.

FIGS. 6, 7A, and 7B illustrate bifurcated delay line configurations incorporating the innovations described above in order to obtain delays of still longer duration.

Each of these configurations comprise two substantially identical branches those branches themselves are substantially identical to the delay lines shown in FIGS. 5A and 5B.

The delay line of FIG. 6 includes two branches physically joined at sides 4 and 5, the sides remote from the transducers. The delay line includes an input transducer T1, an output transducer T2 and intermediate transducers T3 and T4. T3 and T4 are coupled by an electrical coupling element in the form of a variable inductance, series coil L1.

In operation the electrical input signal is applied to input tranducer T1, converted to an acoustic wave that propogates a path confined to the first branch (as described above) whereby it eventually arrives at transducer T3. At T3 it is re-converted to electrical energy. This energy is electrically coupled via L1 to transducer T4, and again converted to acoustic energy so that it propogates the length of the second branch and back, according to the path defined by the reflective pattern detailed above. At T2 the acoustical energy is again converted to electrical energy.

The delay lines shown in FIGS. 7A and 7B are similar to that of FIG. 6 except that the two segments are joined at side 1, the side immediate to and at which the four transducers are bonded. In general it is presently believed that the configurations shown in FIGS. 7A and 7B are in some respects preferable to that shown in FIG. 6. In particular, beamspreading (or divergence) of the mechanical wave in the neighborhood of the transducers can be expected to cause energy to propogate directly between T1 and T2 and between T3 and T4. The beamspreading phenomena would manifest itself as a degradation in the delay line suppression of spurious responses. In the embodiment of FIG. 6, the bifurcated delay line branches perform a "waveguide" function so as to confine the desired wave and prevent spreading into laterally adjacent branches or transducers.

It is expected that the beamspreading effect may be ameliorated by diagonally coupling L1 from T2 to T3 as shown in FIG. 7B. In this way T4 becomes the "output" transducer so that the effect of divergence from T1 to T2 is mitigated. That is, the input wave will no longer directly diverge to the output transducer so as to circumvent the time delay interposed by progogation through the delay line.

The bifurcated delay lines are characterized by a number of significant advantages. To wit: The bifurcated unit can be produced at substantially the same cost as a single delay line and the bonding of the transducers to the solid medium can be done in the single operation required for a single delay line. Splitting of the delay line into two branches or sections can be accommodated by a sawblade that bifurcates the delay line as it slices the separate delay lines from the blank. This operation is inherently more efficient than one which requires individual slicing of the branches and subsequent physical and/or electrical re-connection to form a bifurcated structure.

Because the delay line units are cut from the same crystal, impedance matching between the segments is inherently precise. In addition, the series coupling coil L1, can be used to tune the unit's center frequency and its adjustment allows a small adjustment in the delay line's composite frequency response. Various techniques may be utilized in order to tune L1. For example, L1 may be wound on a magnetic core and the position of the core varied relative to the inductive winding so as to vary the effective inductance presented by L1. More simply, the windings of L1 maybe separated or compressed so as to vary its inductance.

Furthermore, a given delay time can be implemented with a delay line having approximately half the height and/or width of a standard line exhibiting a similar reflective pattern. Although the thickness of the unit will approach two to three times the thickness of the standard (single-section) unit, this is not deemed a significant drawback inasmuch as the thickness dimension is substantially less significant than other dimensions in that it presents a lesser impediment to miniaturization of the delay line.

It should be noted that the number of energy conversions (at the transducers) is twice the number of conversions that occur in standard, single-branch, delay lines so that the delay line insertion loss tends to be greater than (but not necessarily twice) that of standard units. Nevertheless, the increase in insertion loss has been found to be less than 5 db for a 63.943 microsecond delay line used in color television application.

Accordingly, while there have been disclosed and described what at present are considered to be the preferred embodiments of ultrasonic delay lines, it will be obvious to those having ordinary skill in the art that various modifications may be made therein without departure from the scope of this invention as defined by the appended claims.

INDUSTRIAL APPLICABILITY

The subject invention is useful in all electronic equipment utilizing delay lines, especially equipment in which minimal delay line size is desirable.

What is claimed is:

1. A bifurcated electroacoustic delay line comprising: a first branch of transmission medium assuming a substantially pentagonal profile, said profile characterized by:
   (a) a first side,
   (b) second and third sides extending substantially perpendicularly from the first side and in a substantially parallel relationship with each other,
   (c) a fourth side extending from the second side so as to form a first obtuse angle with the second side, and
   (d) a fifth side extending from the third side so as to form a second obtuse angle with the third side, so that said fourth and fifth sides form a third obtuse angle at a point of intersection; said delay line further comprising:
   a second branch of transmission medium assuming a profile substantially identical to the profile assumed by the first branch of transmission medium, wherein said first and second branches are physically joined along their respective fourth and fifth sides,
   a first input transducer bonded to the first side of the first branch,
   a first output transducer bonded to the first side of the first branch,
   a second input transducer bonded to the first side of the second branch,
   a second output transducer bonded to the first side of the second branch, wherein the transducers are arranged so that the first input transducer and second output transducer are positioned laterally adjacent each other and the first output transducer and second input transducer are positioned laterally adjacent each other, and means for electrically coupling the first output and second input transducers.

2. A bifurcated electroacoustic delay line as defined in claim 1 wherein said means comprises an inductance.

3. A bifurcated electroacoustic delay line as defined in claim 2 wherein said inductance comprises means for adjusting the frequency response of the delay line.

4. A bifurcated electroacoustic delay line as defined in claim 3 wherein said first and second obtuse angles are substantially equal.

5. A bifurcated electroacoustic delay line as defined in claim 4 wherein the third obtuse angle is substantially equal to 135 degrees.

6. An electroacoustic delay line as defined in claim 5 wherein the input transducer, the output transducer and the five sides of each of the branches are so arranged that a desired wave launched at the input tranducer travels a path, from the input transducer to the output transducer, comprising at least five reflections, the reflections occurring at the sides of the respective branches so that the path traveled by a desired wave comprises at least six segments.

7. An electroacoustic delay line as defined in claim 6 wherein the path segments circumscribe areas on a surface of the respective branches, said areas available for the deposition of absorbent material useful in the attenuation of spurious waves.

8. An electroacoustic delay line as defined in claim 7 wherein the transmission medium is fabricated from glass, metal, crystaline or ceramic material.

9. An electroacoustic delay line as defined in claim 7 wherein the transducers are fabricated from a piezoelectric material.

10. An electroacoustic delay line as defined in claim 3 wherein the input transducer, the output transducer, and the five sides are so arranged that a desired wave travels a path, from the input to the output transducer, comprising five reflections, the reflections occurring at sides of the transmission medium in that the path traveled by a desired wave consists of six segments.

11. An electroacoustic delay line as defined in claim 10 wherein the path segments circumscribe areas on a surface of the transmission medium, said areas available for the deposition of absorbent material useful in the attenuation of spurious waves.

12. An electroacoustic delay line as defined in claim 11 wherein the transmission medium is fabricated from glass, metal, crystaline or ceramic material.

13. An electroacoustic delay line as defined in claim 11 wherein the transducer are fabricated from a piezoelectric material.

14. A bifurcated electroacoustic delay line as defined in claim 1 wherein the input transducer, the output transducer, and the five sides of each of the branches are so arranged that a desired wave launched at an input transducer propagates along a path, from the input transducer to the respective output transducer, comprising at least five reflections, the reflections occurring at the sides of the respective branches so that the path along which a desired wave propagates comprises at least six segments.

15. A bifurcated electroacoustic delay line as defined in claim 14 wherein the path segments circumscribe areas on a surface of the respective branches, said areas available for the deposition of absorbent material for the attenuation of spurious waves.

16. A bifurcated electroacoustic delay line as defined in claim 15 wherein said means comprises and inductance.

17. A bifurcated electroacoustic delay line as defined in claim 16 wherein said inductance includes a mechanism for adjusting the frequency response of the delay line.

18. A bifurcated, solid transmission medium for an electroacoustic delay line, the medium comprising two substantially identical branches, each branch assuming a generally pentagonal profile, the pentagonal profile characterized by a first side, second and third sides extending substantially perpendicularly from the first side in a substantially parallel relationship with respect to each other, a fourth side extending from the second side so as to form a first obtuse angle with the second side, and a fifth side extending from the third side so as to form a second obtuse angle substantially equal to the first obtuse angle, so that the fourth and fifth sides form a third obtuse angle at a point of intersection, wherein said branches are joined along their respective fourth and fifth sides.

19. A bifurcated, solid transmission medium for an electroacoustic delay line as defined in claim 18 wherein the third obtuse angle is substantially equal to 135 degrees.

20. A bifurcated, solid transmission medium for an electroacoustic delay line as defined in claim 19 wherein each of the branches is constructed so as to provide a path of propogation for waves originating at the first side of the branch, said path comprising:
  (1) a first segment extending substantially parallel to the second side and between the first side and
  (2) a first reflection occurring at the fourth side,
  (3) a second segment extending between the first reflection and
  (4) a second reflection occurring at the third side,
  (5) a third segment extending between the second reflection and
  (6) a third reflection occurring at the first side,
  (7) a fourth segment extending between the third reflection and
  (8) a fourth reflection occurring at the second side, and
  (9) a fifth segment extending between the fourth reflection, and
  (10) a fifth reflection occurring at the fifth side, and
  (11) a sixth segment extending substantially parallel to the third side and between the fifth reflection and the first side.

21. A solid transmission medium as defined in claim 20 wherein the path segments circumscribe areas on the respective surfaces of the branches, said areas available for the deposition of absorbent material for the attenuation of spurious waves.

22. A solid transmission medium as defined in claim 21 and fabricated from glass, metal, crystaline or ceramic material.

* * * * *